US007682852B2

United States Patent
Ryu et al.

(10) Patent No.: US 7,682,852 B2
(45) Date of Patent: Mar. 23, 2010

(54) METHOD OF MANUFACTURING SEMICONDUCTOR LASER DEVICE INCLUDING LIGHT SHIELD PLATE

(75) Inventors: Han-youl Ryu, Suwon-si (KR); Kyoung-ho Ha, Seoul (KR); Youn-joon Sung, Yongin-si (KR)

(73) Assignee: Samsung Led Co., Ltd., Gyeonggi-do (KR)

( * ) Notice: Subject to any disclaimer, the term of this patent is extended or adjusted under 35 U.S.C. 154(b) by 200 days.

(21) Appl. No.: 11/889,121

(22) Filed: Aug. 9, 2007

(65) Prior Publication Data

US 2008/0102546 A1 May 1, 2008

(30) Foreign Application Priority Data

Oct. 27, 2006 (KR) .................. 10-2006-0105042

(51) Int. Cl.
*H01L 21/00* (2006.01)
(52) U.S. Cl. .................. 438/26; 438/28; 438/52; 438/53; 438/154; 438/156; 257/E21.001; 257/E21.505; 257/E21.509; 257/E23.065; 257/E23.101; 257/E21.106; 257/E21.114; 257/E21.191
(58) Field of Classification Search .......... 438/26, 438/34, 52; 257/E21.001, E33.016
See application file for complete search history.

(56) References Cited

U.S. PATENT DOCUMENTS

| 4,742,506 | A * | 5/1988 | Fukumoto et al. ........ 369/44.32 |
| 4,774,711 | A * | 9/1988 | Hara ..................... 372/50.21 |
| 5,808,358 | A * | 9/1998 | Vinciarelli et al. ......... 257/700 |
| 6,175,084 | B1 * | 1/2001 | Saitoh et al. ............. 174/252 |
| 6,501,098 | B2 * | 12/2002 | Yamazaki ................... 257/72 |
| 6,613,610 | B2 * | 9/2003 | Iwafuchi et al. ........... 438/128 |
| 6,724,018 | B2 * | 4/2004 | Ando et al. .............. 257/186 |
| 7,535,942 | B2 * | 5/2009 | Ryu et al. .............. 372/43.01 |
| 2003/0122209 | A1 * | 7/2003 | Uya ........................ 257/435 |
| 2006/0133439 | A1 * | 6/2006 | Yamasaki ................ 372/44.01 |
| 2008/0101422 | A1 * | 5/2008 | Ryu et al. .................... 372/9 |

FOREIGN PATENT DOCUMENTS

JP 405158064 A * 6/1993
JP A-2005-101457 4/2005

* cited by examiner

*Primary Examiner*—Michael S Lebentritt
(74) *Attorney, Agent, or Firm*—Harness, Dickey & Pierce, P.L.C.

(57) ABSTRACT

Provided is a method of manufacturing a semiconductor laser device having a light shield film comprising: forming a light emission structure by depositing a first clad layer, an active layer and a second clad layer on a substrate; depositing a light shield film and a protection film on the light emission face of the light emission structure; removing the light shield film corresponding to an area of the light emission face of the light emission structure including and above the first clad layer; and removing the protection layer.

23 Claims, 4 Drawing Sheets

FAR FIELD ANGLE

FAR FIELD ANGLE

METHOD OF MANUFACTURING SEMICONDUCTOR LASER DEVICE INCLUDING LIGHT SHIELD PLATE

CROSS-REFERENCE TO RELATED PATENT APPLICATION

This application claims the benefit of Korean Patent Application No. 10-2006-0105042, filed on Oct. 27, 2006, in the Korean Intellectual Property Office, the disclosure of which is incorporated herein in its entirety by reference.

BACKGROUND OF THE INVENTION

1. Field of the Invention

The present invention relates to a method of manufacturing a semiconductor laser device, and more particularly to a method of manufacturing a semiconductor laser device having a light shield plate.

2. Description of the Related Art

A laser which mainly emits bluish purple light can be manufactured using semiconductor material. Semiconductor laser devices can emit laser light approximately from ultraviolet rays of wavelength 360 nm to bluish green light of wavelength 490 nm, and lasers in blue and purple regions of wavelengths 400 through 450 nm are used in various fields. Semiconductor laser devices having a wavelength in the proximity of 405 nm are used as a light source of next-generation high-capacity optical storage media such as blue-ray disks and high-definition digital versatile disks (HD DVD). Semiconductor laser devices having a wavelength in the proximity of 450 nm can be used as blue light source of laser display systems. When semiconductor laser devices having wavelengths of 500 nm or higher are available, the semiconductor laser devices could also be used as a green light source of laser display systems. Also, blue-purple semiconductor laser devices could be used as a light source of high-resolution laser printers. Semiconductor laser devices having short wavelengths of 400 nm or lower in the ultraviolet ray region can be manufactured using nitride semiconductor materials and applied for a biological or medical use.

In nitride semiconductor laser devices, when Al composition in the n-clad layer, which is formed of AlGaN, is not sufficiently high or when the n-clad layer is not sufficiently thick, the optical confinement weakens, and thus light can be leaked from a lower surface of the n-clad layer.

In nitride semiconductor laser devices employing a sapphire substrate, light leaked from a lower surface of the n-clad layer exists in an n-contact layer between the sapphire substrate and n-clad layer, and a portion of the leaked light further leaks out of the laser device through a cross-sectional end of the substrate and the n-contact layer that is the end of the laser device from which the laser beam emerges. Also, in nitride semiconductor laser devices grown on a GaN substrate, light leaked from a lower surface of the n clad-layer exists inside the substrate, and a portion of the leaked light further leaks out of the laser device through a cross-sectional end of the substrate that is the end of the laser device from which the laser beam emerges. The leaked light interferes with a far-field pattern of the laser beam emerging from the semiconductor laser devices, illustrated by the formation of ripples in the graphs shown in FIGS. 1A and 1B.

The ripples in the far-field pattern can cause problems in applying the blue-purple semiconductor laser device to a system. For example, when using the blue-purple semiconductor laser devices as blue light source of laser displays, the ripples make display images uneven and thus deteriorate the quality of screen displays. Also, when used as a light source of optical storage media, the ripple shapes increase noise, and thus, errors in reading signals during information reproduction, which causes problems for reliability of the optical pickup.

To decrease the ripples in the far-field pattern, light leakage down from the n-clad layer should be blocked. To do that, the optical confinement needs improving by increasing the Al composition ratio in n-clad layer or thickening the thickness of n-clad layer. However, these methods are limited because compositions comprising excessive amounts of Al or excessively thick n-clad layers increase the probability of inducing cracks during growth for semiconductor laser devices. Light leakage also increases for longer wavelengths of light, and that could be a serious drawback with respect to applications such as a source for laser displays.

Japanese Laid-Open Patent No. 2005-101457 discloses a technique which stops light leakage through a substrate by depositing a light shield membrane on the cross-sectional end of the substrate that is on the end of the laser device through which a laser beam emerges. According to the Japanese Publication, a semiconductor laser device is attached to a jig which can screen a region where the light shield membrane should not be formed on the light emission face of semiconductor laser device, so that the light shield membrane can then be deposited on appropriate regions of the end of the substrate.

SUMMARY OF THE INVENTION

The present invention provides a simpler highly reliable method of manufacturing a semiconductor laser device having a light shield plate which prevents light leakage through a substrate.

According to an aspect of the present invention, there is provided a method of manufacturing a semiconductor laser device comprising: forming a light emission structure by sequentially depositing material layers including a first clad layer, an active layer and a second clad layer on a substrate; sequentially depositing a light shield film and a protection film on a light emission face of the light emission structure; removing a portion of the light shield film corresponding to the area of the light emission structure above and including the first clad layer using a first etchant which selectively etches the light shield film; and removing the protection film.

According to another aspect of the present invention, there is provided a method of manufacturing a semiconductor laser device comprising: forming a light emission structure by sequentially depositing a first clad layer, an active layer and a second clad layer on a substrate; forming a light shield film which covers at least an area below the first clad layer of a light emission face of the light emission structure; forming a protection film on the light shield film so that the upper end of the protection film may not exceed the upper end of the light shield film; and removing a portion of the light shield film corresponding to an area of the light emission face of the light emission structure including and above the first clad layer; and removing the protection film.

According to another aspect of the present invention, there is provided a method of manufacturing a semiconductor laser device comprising: forming a light emission structure by sequentially depositing a first clad layer, an active layer and a second clad layer on a substrate; sequentially depositing a light shield film and a protection film, which are formed of different materials from each other, on the light emission face of the light emission structure; selectively etching only the light shield film and removing a portion of the light shield film corresponding to an area of the light emission face of the light emission structure including and above the first clad layer; and removing the protection film.

As an embodiment, the selective etching of only the light shield film is performed using a wet etching process using a first etchant which selectively etches the light shield film.

As an embodiment, the removing of the protection film is performed using a wet etching process using a second etchant which selectively etches the protection film.

As an embodiment, the light shield film contains a material layer formed of at least one of Si, Ge, $SiO_2$, $TiO_2$, $Ai_2O_3$, AiN, $ZrO_2$, metal materials and dielectric multilayers.

As an embodiment, the substrate is one of a GaN substrate, a SiC substrate and a sapphire substrate.

As an embodiment, a contact layer is further formed between the substrate and the first clad layer, and the light shield film covers the ends of the substrate and the contact layer after removing a portion of the light shield film.

As an embodiment of the present invention, the contact layer is formed of $Al_xGa_{1-x}N$ ($0 \leq x \leq 0.05$).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 2:
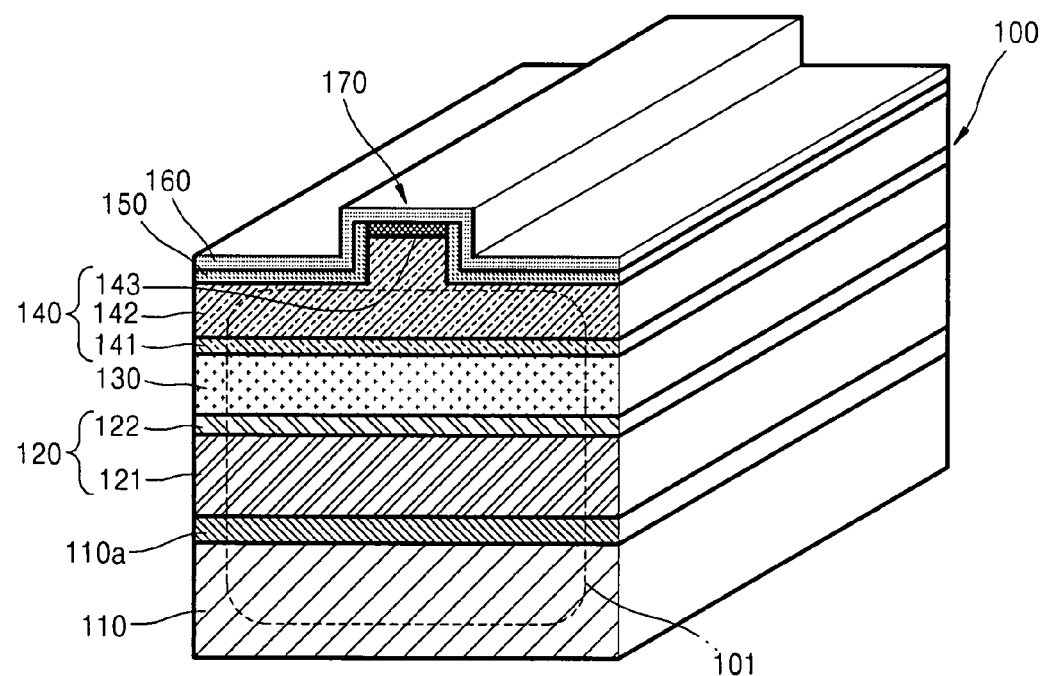
FIG. 2 is a perspective view of a light emission structure of a semiconductor laser device.

FIG. 2 is a perspective view illustrating a light emission structure in a method of manufacturing a semiconductor laser device according to an embodiment of the present invention. FIG. 2 is exaggerated to clearly illustrate features of the semiconductor laser device according to the current embodiment. The nitride semiconductor laser device of the current embodiment is a GaN III-V (group) nitride semiconductor laser device.

Referring to FIG. 2, a light emission structure 100 is formed by sequentially depositing a first material layer 120, an active layer 130 and a second material layer 140 on a substrate 110. A characteristic of the present invention lies in a method of forming a light shield plate 200 below, and the present invention is not limited by the light emission structure 100 shown in FIG. 2 nor by the method of forming the same. The substrate 110 can be a III-V nitride compound semiconductor layer substrate such as a GaN, a SiC, or the like, or a highly resistive substrate such as a sapphire substrate.

The first material layer 120 includes a first clad layer 121. The first clad layer 121 is, for example, a n-AlGaN/GaN layer. A first waveguide layer 122 is a GaN-based Group III-V nitride semiconductor layer, that is, n-GaN layer. The first waveguide layer 122 has a refractive index lower than that of the active layer 130 and higher than that of the first clad layer 121.

The active layer 130 is a material layer emitting light by coupling of carriers such as electrons and holes, and may be a GaN-based Group III-V nitride semiconductor layer having a multi-quantum well (MQW) structure. The active layer 130 may be a material layer formed by adding Indium (In) to the GaN based Group III-V nitride semiconductor layer at a predetermined ratio, for example, an InGaN layer.

The second material layer 140 includes a second clad layer 142 and a cap layer 143. The second clad layer 142 is the same material layer as the first clad layer 121 except that the p-type material is doped. A part of the second clad layer 142 protrudes upward in order to form a ridge wave guide 170. A second wave guide layer 141 may be a GaN based Group III-V nitride semiconductor layer, that is, a p-GaN layer. The second wave guide layer 141 has a refractive index lower than that of the active layer 130 and higher than that of the second clad layer 142.

The composition of the first clad layer 121, the active layer 130, and the second clad layer 142 may be represented as $Al_xGa_{1-x}In_yN_{1-y}$ ($0 \leq x \leq 0.3$, $0 \leq y \leq 0.3$).

The cap layer 143 is a GaN-based Group III-V nitride semiconductor layer, and may be a direct transition type semiconductor layer, doped with p-type conductive impurities, for example, a p-GaN layer. Otherwise, the cap layer 143 may be a GaN layer, or AlGaN layer or InGaN layer including Al or In.

A p-type electrode layer 160 is electrically connected to the cap layer 143, and a current restriction layer 150 makes the p-type electrode layer 160 limitedly contact the cap layer 143.

When employing a sapphire substrate as the substrate 110, a contact layer 110a can further be formed between the substrate 110 and second clad layer 142 for supplying electric current to the second clad layer 142. The contact layer 110a may be formed of $Al_xGa_{1-x}N$ ($0 \leq x \leq 0.05$).

Figure 3:
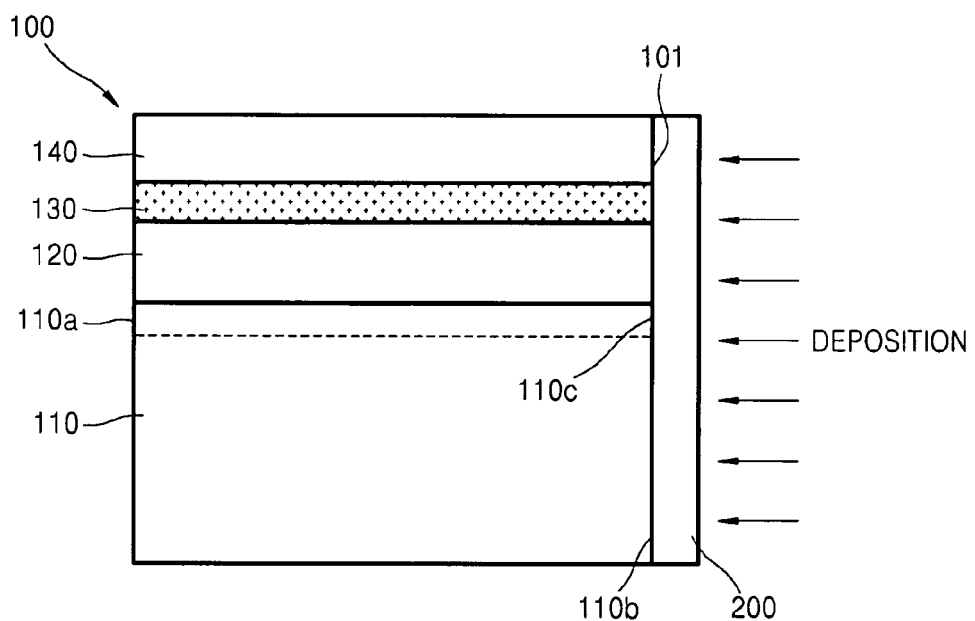
FIG. 3 is a diagram for illustrating a process of forming a light shield plate on a light emission face of a light emission structure.

After forming the light emission structure 100 on the substrate 110, a light shield film 200 is formed on a light emission face 101 light emission facelight emission facelight emission face of the light emission structure as shown in FIG. 3. The light shield film 200 is formed by depositing at least one layer using materials which absorb or reflect light. The deposition method is not particularly limited. For example, the light shield film 200 may contain a material layer formed of at least one of Si, Ge, $SiO_2$, $TiO_2$, $Ai_2O_3$, AiN, $ZrO_2$, metal substances and dielectric multilayers ($SiO_2/TiO_2$). Since it is not necessary to perform masking here, the light shield film 200 can be deposited to cover the entire light emission face 101 of light emission structure 100, or at least the area below the first clad layer 121 which corresponds to an end 110b and an end 110c of a contact layer 110a of the substrate 110 on the light emission face 101 formed when using a sapphire substrate.

Figure 4:
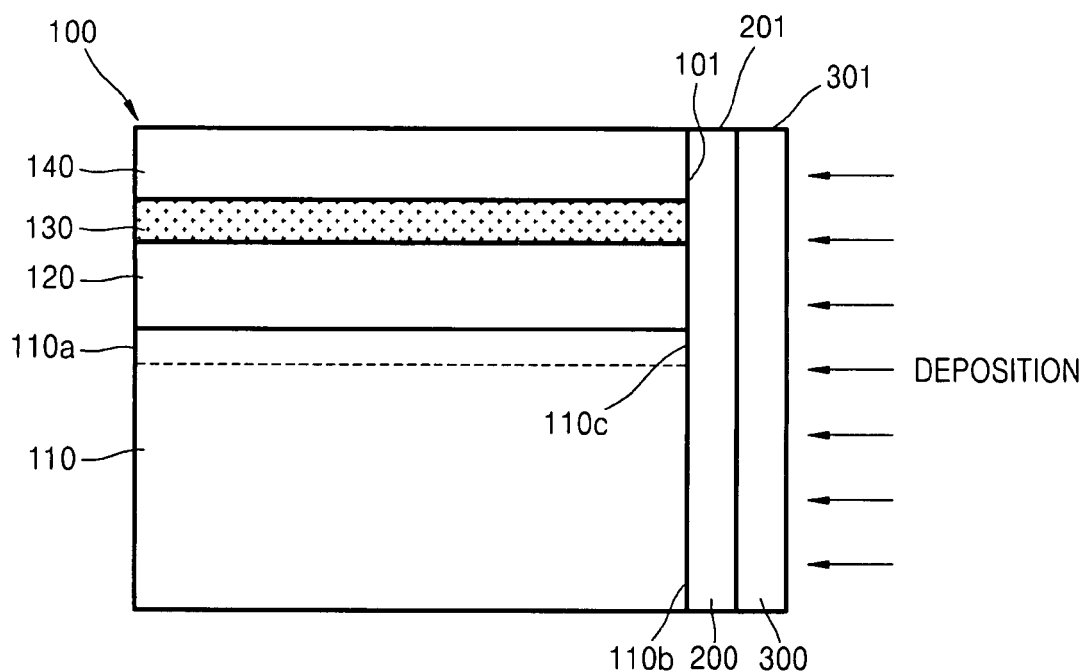
FIG. 4 is a diagram for illustrating a process of forming a protection film which covers the light shield plate.

Next, as shown in FIG. 4, a protection film 300 is formed by depositing a predetermined protection material on the light shield film 200. The protection film 300 is formed to prevent the light shield film 200 on the area below the first clad layer 121 from being removed during a process of partially removing the light shield film 200. The protection film 300 can be deposited to cover the entire light shield film 200, or at least the area of the light shield film 200 below the first clad layer 121, which corresponds to an end 110b of the substrate 110 and an end 110c of the contact layer 110a when using a sapphire substrate. The upper end 301 of the protection film 300 should not be formed to cover the upper end 201 of the light shield film 200 to allow for a subsequent process of removing a portion of the light shield film 200.

Figure 5:
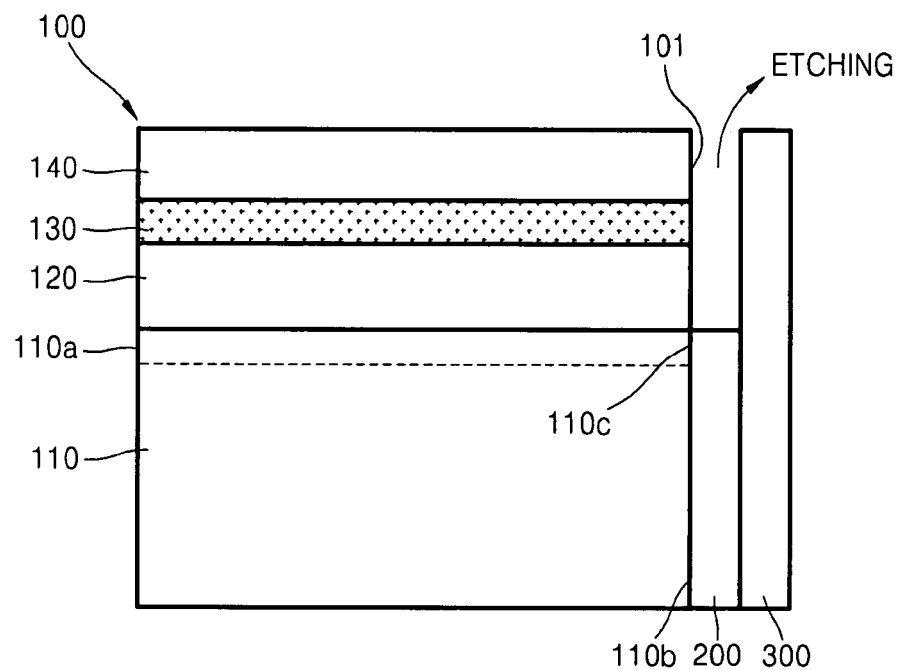
FIG. 5 is a diagram for illustrating a process of removing a portion of the light shield plate.

Then, the process of removing a portion of light shield film 200 is performed as shown in FIG. 5. This process is performed by wet etching using a first etchant which has a selective etching capacity for the light shield film 200. The first etchant etches the material constituting the light shield film 200, but does not etch the material constituting the protection film 300. For example, KOH can be used as the first etchant when the light shield film 200 is formed by depositing Si and the protection film 300 is formed by depositing $SiO_2$. In another example, a metal etchant can be used as the first etchant when the light shield film 200 is formed by depositing metal substances such as Au, Cr, etc. and the protection film 300 is formed by depositing $SiO_2$. Through this process, the light shield film 200 corresponding to the area of the first clad layer 121 and above is etched and removed.

Next, the process of removing the protection film 300 is performed. This process is performed by wet etching using a second etchant which selectively etches the protection film 300. The second etchant etches the material constituting the protection film 300, but does not etch the material constituting the light shield film 200. For example, HF can be used as the second etchant when the light shield film 200 is formed by depositing Si, and the protection film 300 is formed by depositing $SiO_2$. In another example, HF can be used as the second etchant when the light shield film 200 is formed by depositing metal materials such as Au, Cr or the like, and the protection film 300 is formed by depositing $SiO_2$. Through this process, all of the protection film 300 or at least a portion of the protection film 300 corresponding to the area of the first clad layer 121 and above is removed.

By performing the above processes, a nitride semiconductor laser device including the light shield film 200 which covers the end 110b of the substrate 110 and the end 110c of the contact layer 110a formed when a sapphire substrate is used on the light emission face 101 is manufactured.

When the first and second material layer 120 and 140 are supplied with electric current, light emission occurs in the active layer 130 by a carrier recombination of electron-hole, etc. The first and second waveguide layers 122 and 141, which are disposed respectively below and above the active layer 130, amplify light emitted from the active layer 130.

Figure 1A:
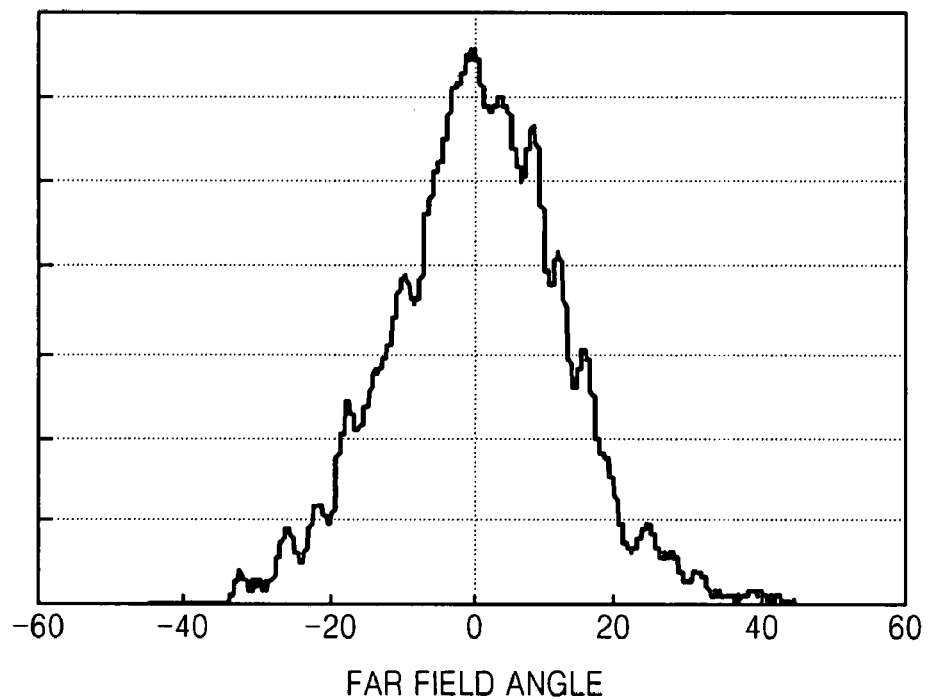
FIG. 1A is a graph showing ripples in the far-field pattern of a conventional nitride semiconductor laser device employing a sapphire substrate.
Figure 1B:
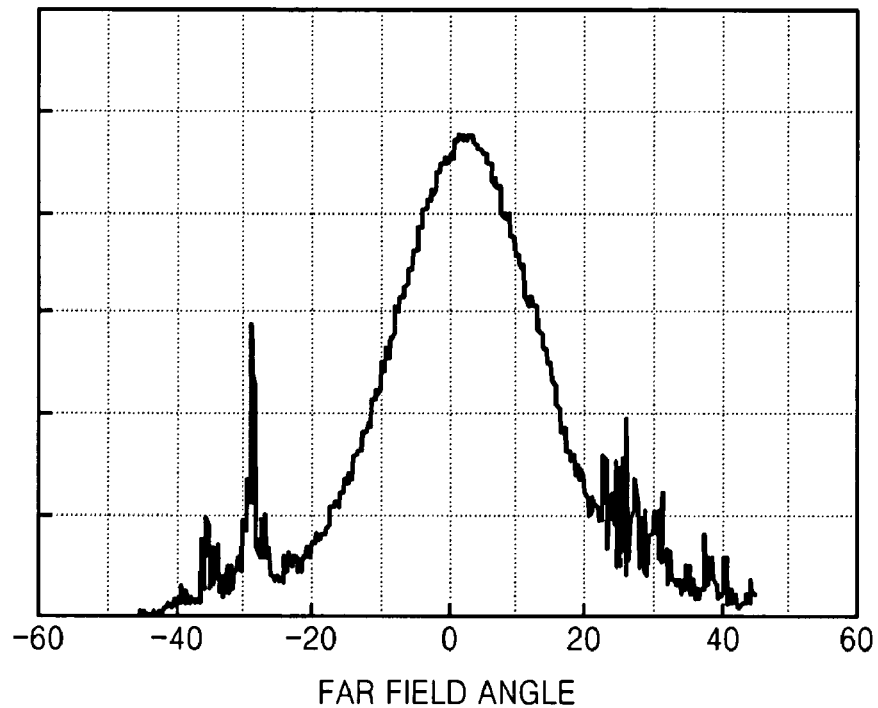
FIG. 1B is a graph showing ripples in the far-field pattern of a conventional nitride semiconductor laser device employing a GaN substrate.
Figure 6:
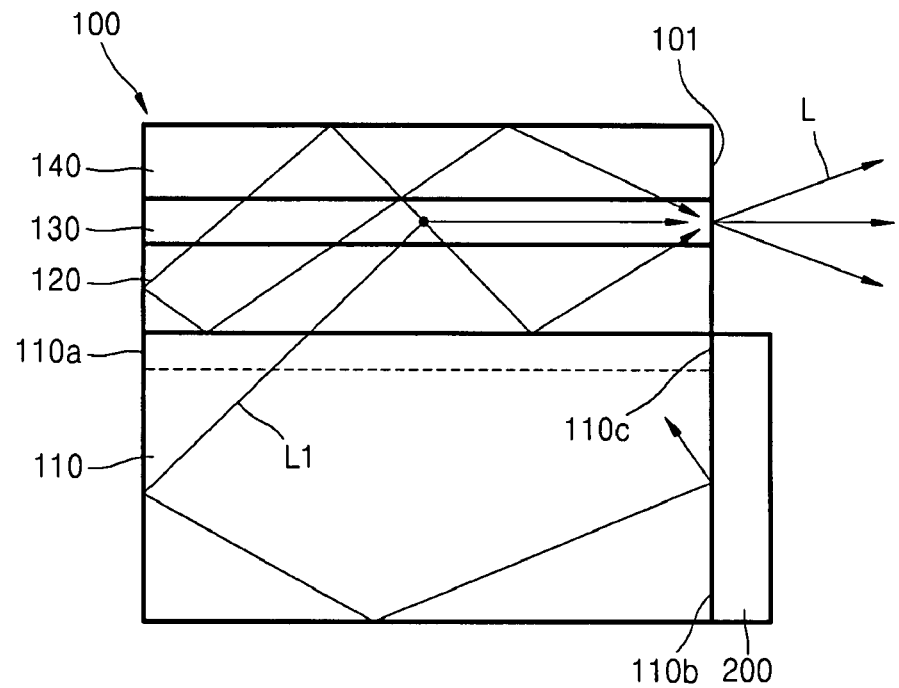
FIG. 6 is a diagram for illustrating an operational state of a nitride semiconductor laser device after removing of the protection film.
Figure 7:
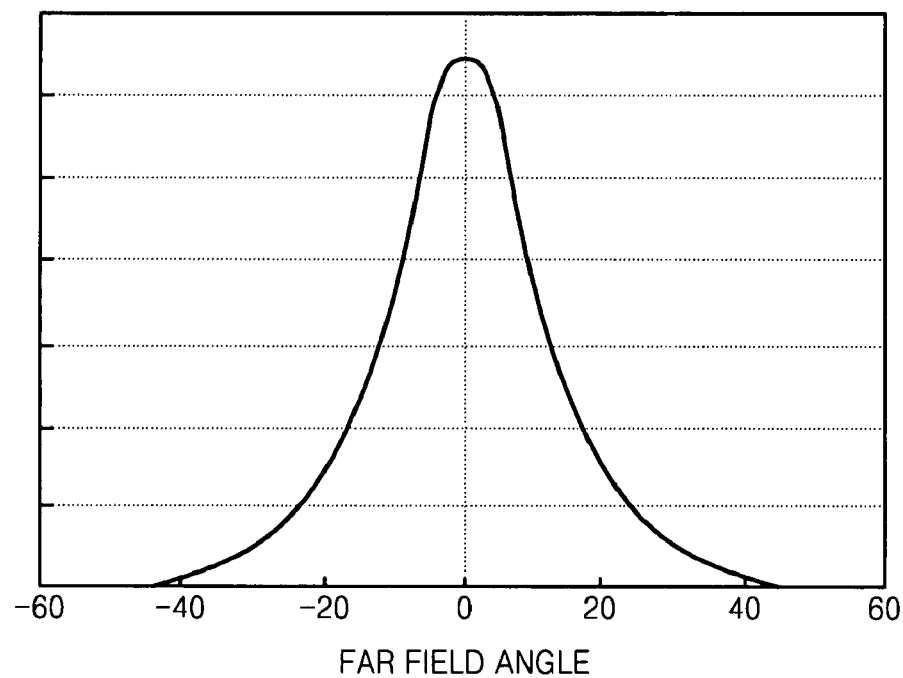
FIG. 7 is a graph showing a far-field pattern of a nitride semiconductor laser device according to a method of the present invention.

The amplified light (L) is emitted through the light emission face 101 of light emission structure 100. Here, a portion of light L1 generated from the active layer 130 leaks through the first clad layer 121 to the contact layer 110a and the substrate 110, as shown in FIG. 6. The light L1 which leaks through the end 110b of the substrate 110 or the end 110c of the contact layer 110a causes interference in far-field pattern of light and forms ripples in the far-field pattern as shown in FIGS. 1A and 1B. In the semiconductor laser device according to the current embodiment, as shown in FIG. 6, the light L1 which leaks to the contact layer 110a and the substrate 110 is blocked by the light shield film 200 and thus light leakage through the end 110b of the substrate 110 or the end 110c of the contact layer 110a does not occur. As a result, high-quality light with no ripples in a far-field pattern, as shown in FIG. 7, can be obtained.

As described above, the effects obtained from the method of manufacturing semiconductor laser device according to the embodiments of the present invention are as follows.

First, the process of manufacturing light shield film is simple because masking is not particularly required when depositing the light shield film and protection film and removing the protection film and a portion of the light shield film.

Second, light quality can be improved by increased positional accuracy of the light shield film because deposition and etching processes can be controlled with high precision.

Third, highly reliable manufacturing of nitride semiconductor laser device can be realized since physical force is not applied to the light emission face in the process forming the light shield film, so that damage to the light emission face can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor laser device comprising:
    forming a light emission structure by sequentially depositing material layers including a first clad layer, an active layer and a second clad layer on a substrate;
    sequentially depositing a light shield film and a protection film on a light emission face of the light emission structure;
    removing a portion of the light shield film corresponding to the area of the light emission structure above and including the first clad layer using a first etchant which selectively etches the light shield film; and
    removing the protection film.

2. The method of claim 1, wherein the removing of protection film is performed using a wet etching process using a second etchant which selectively etches the protection film.

3. The method of claim 1, wherein the light shield film absorbs or reflects light.

4. The method of claim 1, wherein the light shield film contains a material layer which is formed of at least one of Si, Ge, $SiO_2$, $TiO_2$, $Al_2O_3$, AiN, $ZrO_2$, metal materials and dielectric multilayers.

5. The method of claim 1, wherein the substrate is one of a GaN substrate, a SIC substrate and a sapphire substrate.

6. The method of claim 5, wherein a contact layer is further formed between the substrate and the first clad layer, and the light shield film covers the ends of the substrate and the contact layer after removing a portion of the light shield film.

7. The method of claim 6, wherein the contact layer is formed of $Al_xGa_{1-x}(0 \leq x \leq 0.05)$.

8. A method of manufacturing a semiconductor laser device comprising:
    forming a light emission structure by sequentially depositing a first clad layer, an active layer and a second clad layer on a substrate;
    forming a light shield film which covers at least an area below the first clad layer of a light emission face of the light emission structure;
    forming a protection film on the light shield film so that the upper end of the protection film may not exceed the upper end of the light shield film; and
    removing a portion of the light shield film corresponding to an area of the light emission face of the light emission structure including and above the first clad layer; and
    removing the protection film.

9. The method of claim 8, wherein the removing of the light shield film is performed using a wet etching process using a first etchant which selectively etches the light shield film.

10. The method of claim 8, wherein the removing of protection film is performed by a wet process using a second etchant which selectively etches the protection film.

11. The method of claim 8, wherein the light shield film absorbs or reflects light.

12. The method of claim 8, wherein the light shield film contains a material layer formed of at least one of Si, Ge, $SiO_2$, $TiO_2$, $Ai_2O_3$, AiN, $ZrO_2$, metal materials and dielectric multilayers.

13. The method of claim 8, wherein the substrate is one of a GaN substrate, a SIC substrate and a sapphire substrate.

14. The method of claim 13, wherein a contact layer is further formed between the substrate and the first clad layer and the light shield film covers the ends of the substrate and the contact layer after removing a portion of the light shield film.

15. The method of claim 14, wherein the contact layer is formed of $Al_xGa_{1-x}(0 \leq x \leq 0.05)$.

16. A method of manufacturing a semiconductor laser device comprising:
    forming a light emission structure by sequentially depositing a first clad layer, an active layer and a second clad layer on a substrate;
    sequentially depositing a light shield film and a protection film, which are formed of different materials from each other, on the light emission face of the light emission structure;
    selectively etching only the light shield film and removing a portion of the light shield film corresponding to an area of the light emission face of the light emission structure including and above the first clad layer; and
    removing the protection film.

17. The method of claim 16, wherein the selective etching of only the light shield film is performed using a wet etching process using a first etchant which selectively etches the light shield film.

18. The method of claim 16, wherein the removing of the protection film is performed using a wet etching process using a second etchant which selectively etches the protection film.

19. The method of claim 16, wherein the light shield film absorbs or reflects light.

20. The method of claim 16, wherein the light shield film contains a material layer formed of at least one of Si, Ge, $SiO_2$, $TiO_2$, $Ai_2O_3$, AiN, $ZrO_2$, metal materials and dielectric multilayers.

21. The method of claim 16, wherein the substrate is one of a GaN substrate, a SiC substrate and a sapphire substrate.

22. The method of claim 21, wherein a contact layer is further formed between the substrate and the first clad layer, and the light shield film covers the ends of the substrate and the contact layer after removing a portion of the light shield film.

23. The method of claim 22, wherein the contact layer is formed of $Al_xGa_{1-x}(0 \leq x \leq 0.05)$.

* * * * *